(12) United States Patent
Huang et al.

(10) Patent No.: US 7,259,047 B2
(45) Date of Patent: Aug. 21, 2007

(54) METHOD FOR MANUFACTURING ORGANIC THIN-FILM TRANSISTOR WITH PLASTIC SUBSTRATE

(75) Inventors: Liang-Ying Huang, Taichung County (TW); Jia-Chong Ho, Taipei County (TW); Cheng-Chung Lee, Taitung (TW)

(73) Assignee: Industrial Technology Research Institute, Hsinchu (TW)

( * ) Notice: Subject to any disclaimer, the term of this patent is extended or adjusted under 35 U.S.C. 154(b) by 313 days.

(21) Appl. No.: 11/095,594

(22) Filed: Apr. 1, 2005

(65) Prior Publication Data

US 2006/0030067 A1 Feb. 9, 2006

(30) Foreign Application Priority Data

Aug. 6, 2004 (TW) .............................. 93123562 A
Jan. 11, 2005 (TW) .............................. 94100694 A (51) Int. Cl.
*H01L 21/00* (2006.01)
(52) U.S. Cl. ........................... 438/149; 438/FOR. 201; 438/FOR. 184; 257/E21.372; 257/E21.416

(58) Field of Classification Search ................ 438/149, 438/FOR. 201, FOR. 184; 257/E21.372, 257/E21.416
See application file for complete search history.

(56) References Cited

U.S. PATENT DOCUMENTS

| 2004/0036201 A1* | 2/2004 | Chou et al. ................. 264/402 |
| 2004/0063267 A1* | 4/2004 | Bernds et al. ............. 438/202 |
| 2005/0062195 A1* | 3/2005 | Chao et al. ................. 264/219 |

* cited by examiner

*Primary Examiner*—Matthew Smith
*Assistant Examiner*—Thanh V. Pham
(74) *Attorney, Agent, or Firm*—Troxell Law Office, PLLC (57) ABSTRACT

A method for manufacturing an organic thin-film transistor with a plastic substrate, comprising steps of: providing a mold and a plastic substrate, said mold being provided with a relief printing structure; imprinting said plastic substrate by said mold so as to define source/drain electrode regions on said plastic substrate; forming a first electrode layer so as to form source/drain electrodes on said source/drain electrode regions on said plastic substrate; forming a plurality of semiconductor mesas, each of said semiconductor mesas covering a pair of said source/drain electrodes; forming an insulating layer; forming a second electrode layer, being separated from and on said semiconductor mesas by said insulating layer; and forming a passivation layer.

27 Claims, 8 Drawing Sheets

METHOD FOR MANUFACTURING ORGANIC THIN-FILM TRANSISTOR WITH PLASTIC SUBSTRATE

FIELD OF THE INVENTION

The present invention generally relates to a method for manufacturing an organic thin-film transistor (OTFT) with a plastic substrate and, more particularly, to a method for forming an OTFT by imprinting as to define electrode regions.

BACKGROUND OF THE INVENTION

In recent years, organic thin-film transistors (OTFT's) have been widely used in various applications. More particularly, the OTFT is promising in flexible displays because it has advantages in lightness, thickness, portability, and flexibility. Plastic materials such as PMMA can change the alignment of organic materials such as pentacene. Therefore, PMMA is suitable for use as a substrate for OTFT. However, conventional manufacturing processes such as photo-lithography and etching may cause damages on the plastic substrate, and thus are not useful in OTFT fabrication.

Accordingly, there exist in conventional OTFT manufacturing processes some problems, such as:

1. longer fabrication time and higher material cost due to complicated processing steps;
2. lower yield due to undesirable substrate etch by chemicals during photo-lithography and etching processes; and
3. poorer electronic characteristics because the conventional glass substrate provides no alignment effect for the organic materials.

Therefore, there is need in providing a method for manufacturing an organic thin-film transistor (OTFT) with a plastic substrate so as to overcome the aforementioned problems.

SUMMARY OF THE INVENTION

It is the primary object of the present invention to provide a method for manufacturing an organic thin-film transistor (OTFT) with a plastic substrate, characterized in that LIGA (Lithographie GalVanoformung Abformung) is used to define the electrode regions so that the fabrication procedure is simplified and the material cost is reduced.

It is another object of the present invention to provide a method for manufacturing an organic thin-film transistor with a plastic substrate, characterized in that conventional processes such as photo-lithography and etching are avoided so as to improve the yield and assure the device performance since undesirable etch may occur due to the chemicals utilized.

It is still another object of the present invention to provide a method for manufacturing an organic thin-film transistor with a plastic substrate, characterized in that the plastic substrate can separate the electrodes and enhance the carrier mobility due to lattice rearrangement of the organic semiconductor material such as pentacene.

In order to achieve the foregoing objects, in a first embodiment, the present invention provides a method for manufacturing an organic thin-film transistor with a plastic substrate, comprising steps of: providing a mold and a plastic substrate, said mold being provided with a relief printing structure; imprinting said plastic substrate by said mold so as to define source/drain electrode regions on said plastic substrate; forming a first electrode layer so as to form source/drain electrodes on said source/drain electrode regions on said plastic substrate; forming a plurality of semiconductor mesas, each of said semiconductor mesas covering a pair of said source/drain electrodes; forming an insulating layer; forming a second electrode layer, being separated from and on said semiconductor mesas by said insulating layer; and forming a passivation layer.

It is preferable that the plastic substrate comprises polymer materials having —$CH_3$ or —$NH_2$ functional groups such as PMMA (poly-methylmethacrylate), mCOC (metallocenebased cyclic olefin copolymer), etc.

In a second embodiment, the present invention provides a method for manufacturing an organic thin-film transistor with a plastic substrate, comprising steps of: providing a mold and a plastic substrate, said mold being provided with a relief printing structure; imprinting said plastic substrate by said mold so as to define gate electrode regions on said plastic substrate; forming a first electrode layer so as to form gate electrodes on said gate electrode regions on said plastic substrate; forming an insulating layer; forming a plurality of semiconductor mesas, each of said semiconductor mesas being separated from and on one of said gate electrode by said insulating layer; forming a second electrode layer so as to form source/drain electrodes on said plurality of semiconductor mesas; and forming a passivation layer.

In a third embodiment, the present invention provides a method for manufacturing an organic thin-film transistor with a plastic substrate, comprising steps of: providing a mold and a plastic substrate, said mold being provided with a relief printing structure; imprinting said plastic substrate by said mold so as to define gate electrode regions on said plastic substrate; forming a first electrode layer so as to form gate electrodes on said gate electrode regions on said plastic substrate; forming an insulating layer; forming a second electrode layer so as to form a pair of source/drain electrodes being separated and on each of said gate electrodes by said insulating layer; forming a plurality of semiconductor mesas, each of said semiconductor mesas covering a pair of said source/drain electrodes; and forming a passivation layer.

In a fourth embodiment, the present invention provides a method for manufacturing an organic thin-film transistor with a plastic substrate, comprising steps of: providing a mold and a plastic substrate, said mold being provided with a relief printing structure; imprinting said plastic substrate by said mold so as to define gate electrode regions and source/drain electrode regions on said plastic substrate, each of said gate electrode regions being disposed between a pair of said source/drain electrode regions; forming an electrode layer so as to form gate electrodes on said gate electrode regions and source/drain electrodes on said source/drain electrode regions on said plastic substrate; forming a plurality of insulating mesas, each of said insulating mesas covering one of said gate electrodes; forming a plurality of semiconductor mesas, each of said semiconductor mesas covering one of said insulating mesas and a pair of said source/drain electrodes; and forming a passivation layer.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiment of the present invention will be readily understood by the accompanying drawings and detailed descriptions.

DETAILED DESCRIPTION OF THE INVENTION

The present invention providing a method for manufacturing an organic thin-film transistor with a plastic substrate can be exemplified by the preferred embodiments as described hereinafter.

FIRST EMBODIMENT

Please refer to FIG. 1A to FIG. 1G, which illustrate schematic diagrams showing steps in the method for manufacturing an organic thin-film transistor with a plastic substrate according to a first embodiment of the present invention. These steps are described hereinafter.

Figure 1A:
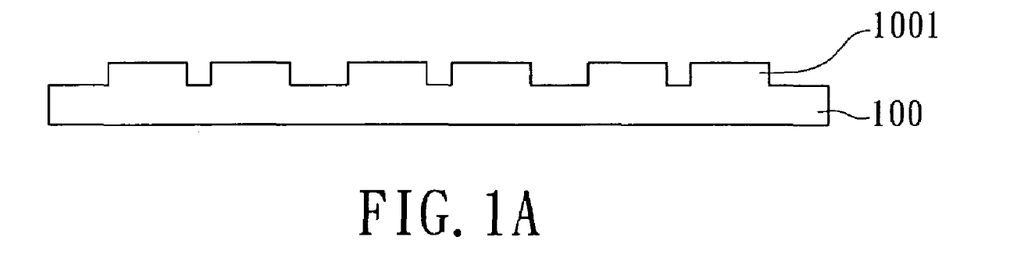
FIG. 1A to FIG. 1G are schematic diagrams showing steps in the method for manufacturing an organic thin-film transistor with a plastic substrate according to a first embodiment of the present invention.

As shown in FIG. 1A, a mold 100 is provided with a relief printing structure 1001, which is implemented by LIGA (Lithographie GalVanoformung Abformung), resulting in higher aspect ratio and lower surface roughness. In LIGA process, the mold 100 is coated by a dry film or a polymer layer (not shown) of 10 μm~1000 μm in thickness. Laser process is then performed on the dry film or the polymer layer so as to form the relief printing structure 1001.

Figure 1B:
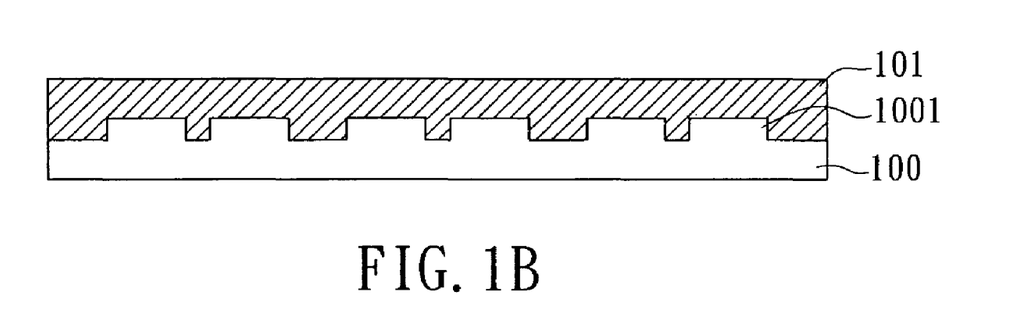

As shown in FIG. 1B, the plastic substrate 101 is imprinted using the mold 100 so as to define the source/drain electrode regions 1010 as well as the channel length on the plastic substrate 101. In the first embodiment, the plastic substrate 101 comprises polymer materials having —$CH_3$ or —$NH_2$ functional groups such as PMMA (poly-methylmethacrylate), mCOC (metallocenebased cyclic olefin copolymer), etc. As the conventional glass substrate is replaced by the plastic substrate 101, no interlayer is required so as enhance the carrier mobility because the organic semiconductor material exhibits single crystal or large grain size of poly-crystal. Furthermore, the plastic substrate 101 is formed by imprinted without conventional photo-lithography and etching so as to reduce fabrication time and the channel length since.

Figure 1C:
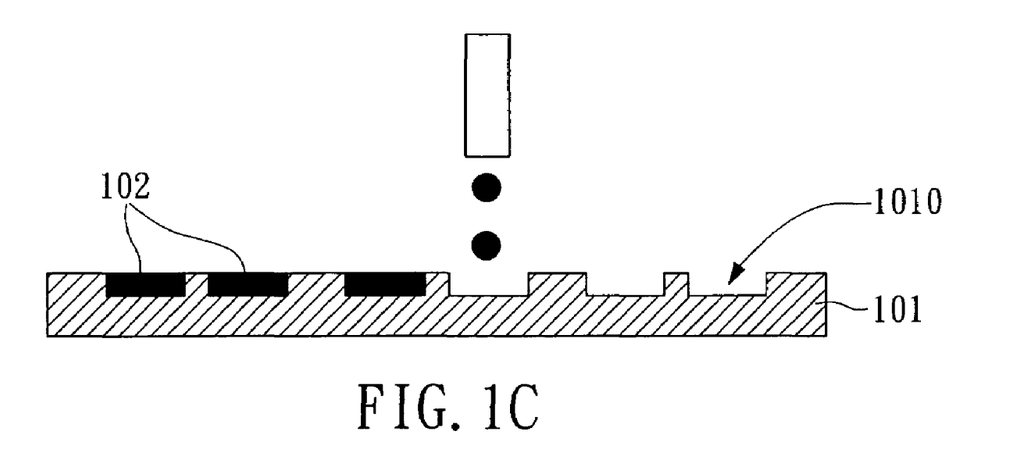
Figure 1D:
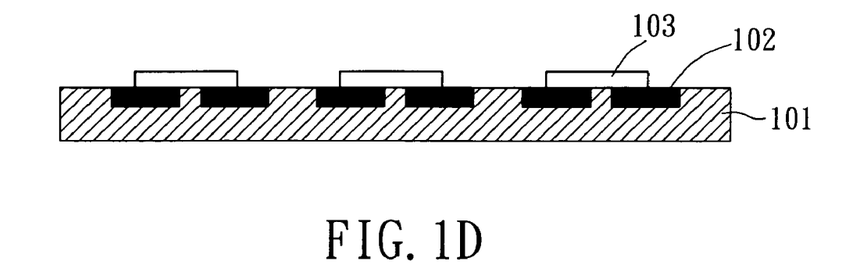
Figure 1E:
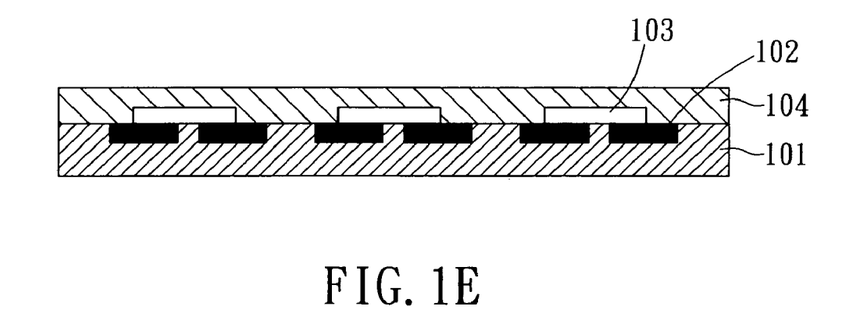
Figure 1F:
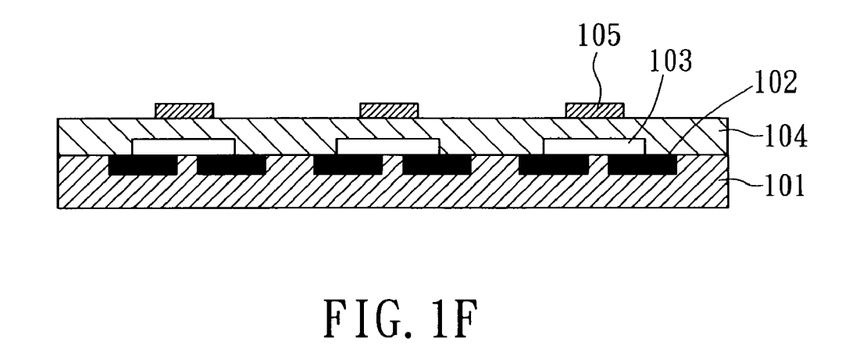
Figure 1G:
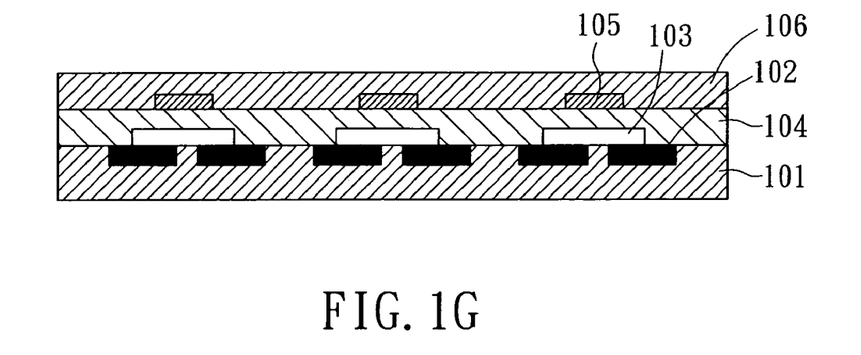

As shown in FIG. 1C, ink-jet printing (or the like) is used to fill the source/drain electrode regions 1010 on the plastic substrate 101 with conductive polymer materials so as to form a first electrode layer 102. The first electrode layer 102 forms the source and the drain electrodes. While conductive polymer is hydrophilic and PMMA and mCOC are not, the electrode regions 1010 separate the hydrophilic electrodes 102 and also enhance the carrier mobility by rearrangement of the organic semiconductor.

As shown in FIG. 1D to FIG. 1G, one process selected from evaporation, printing and spin-coating is performed to form a plurality of semiconductor mesas 103 covering the source/drain electrodes 102, followed by the formation of an insulating layer 104 and a second electrode layer 105, which forms the gate electrode. A passivation layer 106 is later formed. The detailed description of the OTFT is omitted since those with ordinary skills in the art can easily understand.

SECOND EMBODIMENT

Please refer to FIG. 2A to FIG. 2G, which illustrate schematic diagrams showing steps in the method for manufacturing an organic thin-film transistor with a plastic substrate according to a second embodiment of the present invention. These steps are described hereinafter.

Figure 2A:
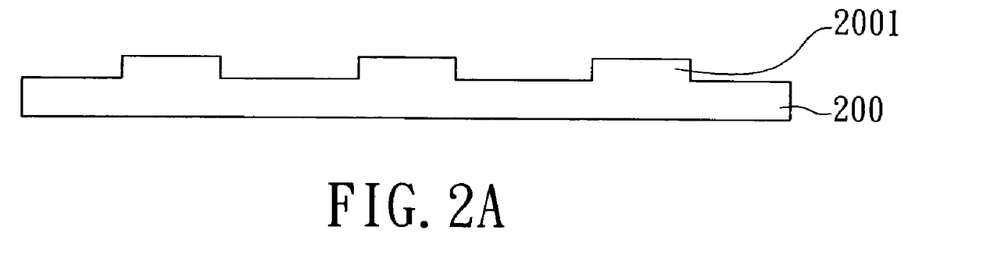
FIG. 2A to FIG. 2G are schematic diagrams showing steps in the method for manufacturing an organic thin-film transistor with a plastic substrate according to a second embodiment of the present invention.

As shown in FIG. 2A, a mold 200 is provided with a relief printing structure 2001, which is implemented by LIGA (Lithographie GalVanoformung Abformung), resulting in higher aspect ratio and lower surface roughness.

Figure 2B:
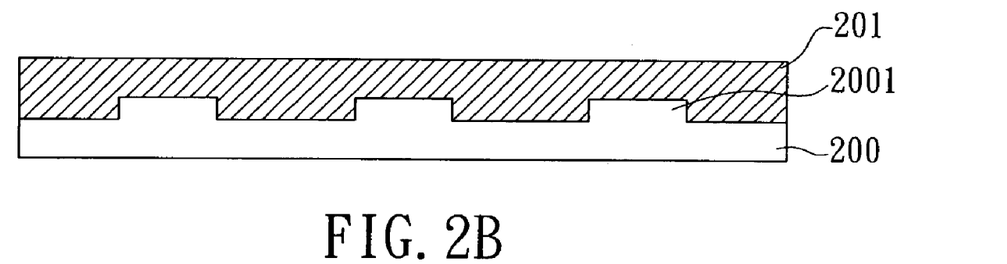

As shown in FIG. 2B, the plastic substrate 201 is imprinted using the mold 200 so as to define the gate electrode regions 2010 on the plastic substrate 201. In the second embodiment, the plastic substrate 201 comprises polymer materials having —$CH_3$ or —$NH_2$ functional groups such as PMMA (poly-methylmethacrylate), mCOC (metallocenebased cyclic olefin copolymer), etc. The plastic substrate 201 is formed by imprinted without conventional photo-lithography and etching so as to reduce fabrication time and the channel length since.

Figure 2C:
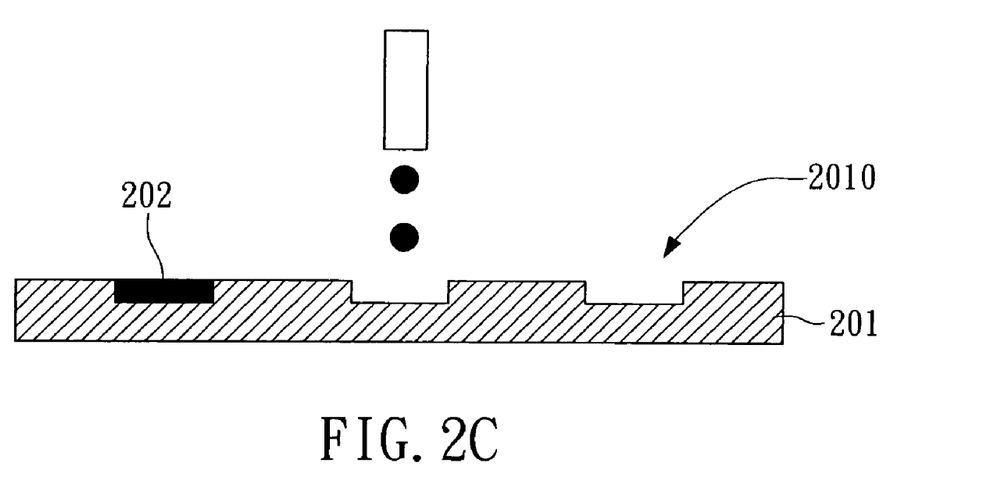
Figure 2D:
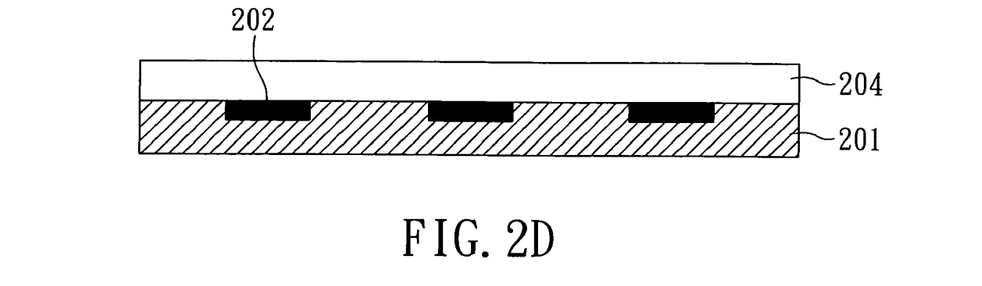
Figure 2E:
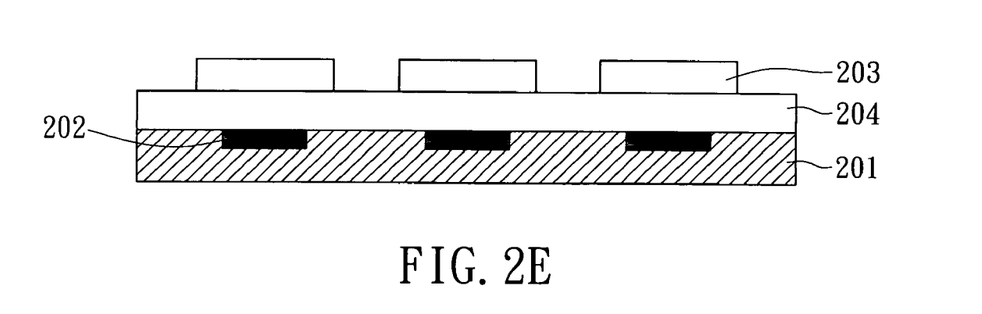
Figure 2F:
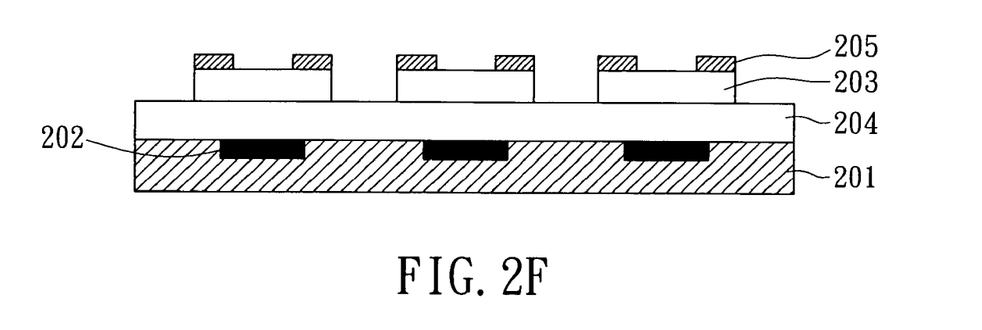
Figure 2G:
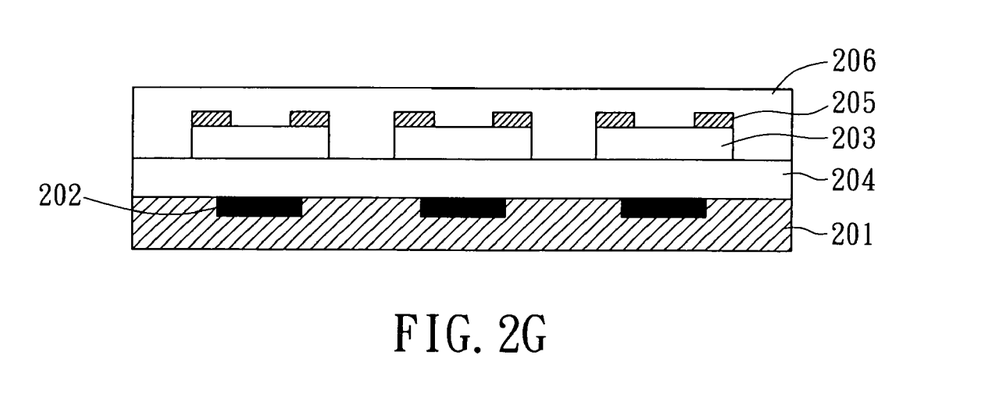

As shown in FIG. 2C, ink-jet printing (or the like) is used to fill the gate electrode regions 2010 on the plastic substrate 201 with conductive polymer materials so as to form a first electrode layer 202. The first electrode layer 202 forms the gate electrodes.

As shown in FIG. 2D to FIG. 2G, one process selected from evaporation, printing and spin-coating is performed to form an insulating layer 204, followed by the formation of a plurality of semiconductor mesas 203, each being separated from and on one of the gate electrodes 202 by the insulating layer 204, and a second electrode layer 205, forming source/drain electrodes on the semiconductor mesas 203. A passivation layer 206 is later formed. The detailed description of the OTFT is omitted since those with ordinary skills in the art can easily understand.

THIRD EMBODIMENT

Please refer to FIG. 3A to FIG. 3G, which illustrate schematic diagrams showing steps in the method for manufacturing an organic thin-film transistor with a plastic substrate according to a third embodiment of the present invention. These steps are described hereinafter.

Figure 3A:
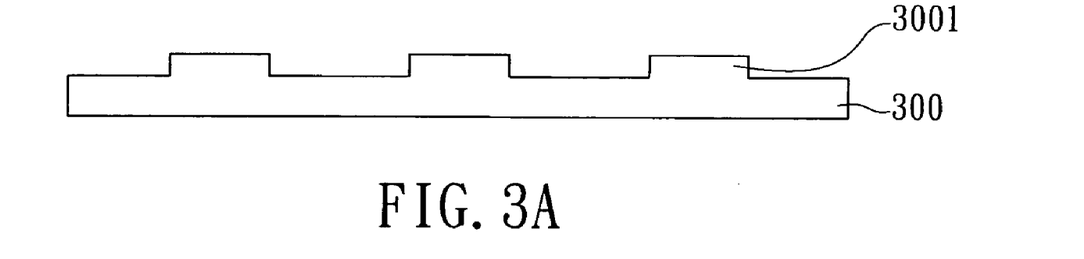
FIG. 3A to FIG. 3G are schematic diagrams showing steps in the method for manufacturing an organic thin-film transistor with a plastic substrate according to a third embodiment of the present invention.

As shown in FIG. 3A, a mold 300 is provided with a relief printing structure 3001, which is implemented by LIGA (Lithographie GalVanoformung Abformung), resulting in higher aspect ratio and lower surface roughness.

Figure 3B:
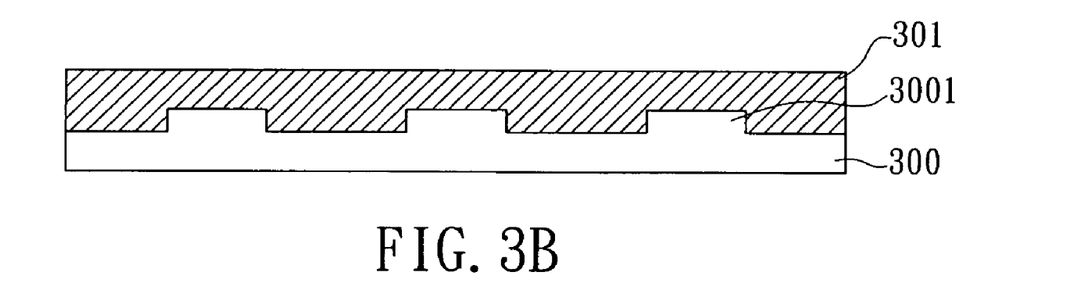

As shown in FIG. 3B, the plastic substrate 301 is imprinted using the mold 300 so as to define the gate electrode regions 3010 on the plastic substrate 301. In the third embodiment, the plastic substrate 301 comprises polymer materials having —$CH_3$ or —$NH_2$ functional groups such as PMMA (poly-methylmethacrylate), mCOC (metallocenebased cyclic olefin copolymer), etc. The plastic substrate 301 is formed by imprinted without conventional photo-lithography and etching so as to reduce fabrication time and the channel length since.

Figure 3C:
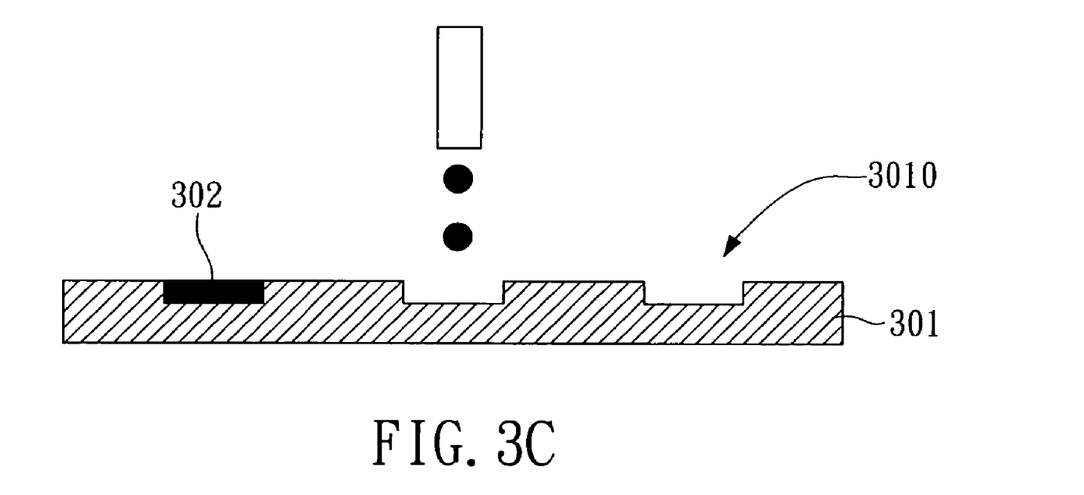
Figure 3D:
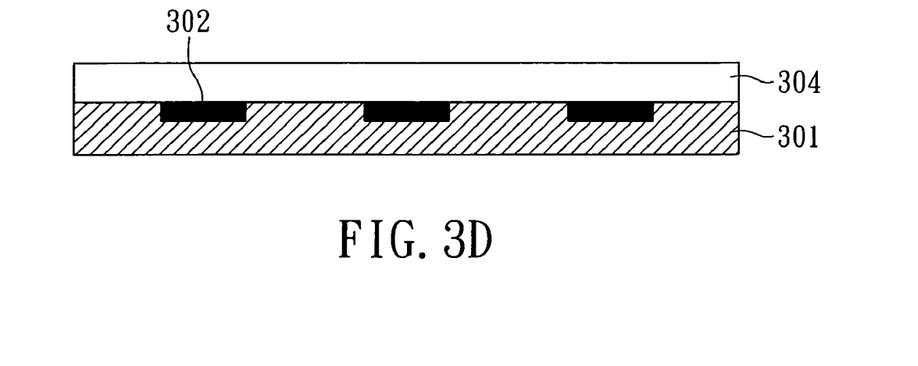
Figure 3E:
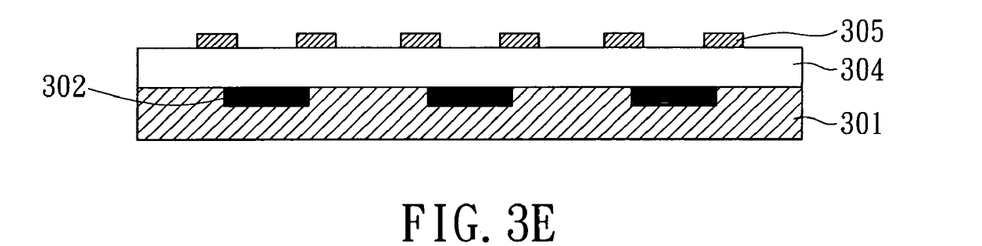
Figure 3F:
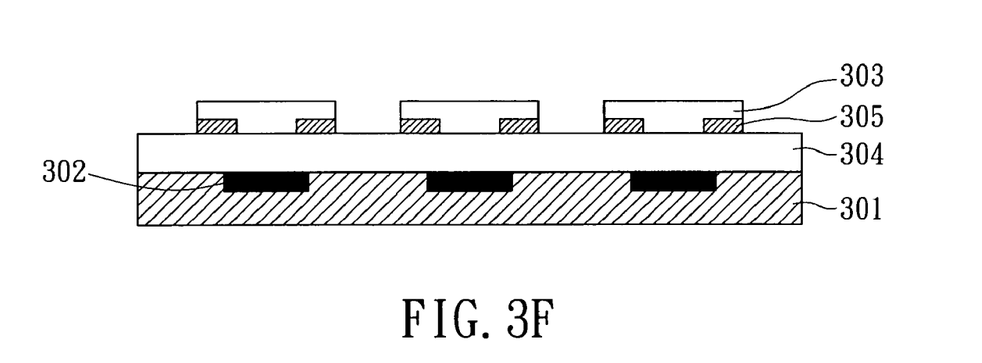
Figure 3G:
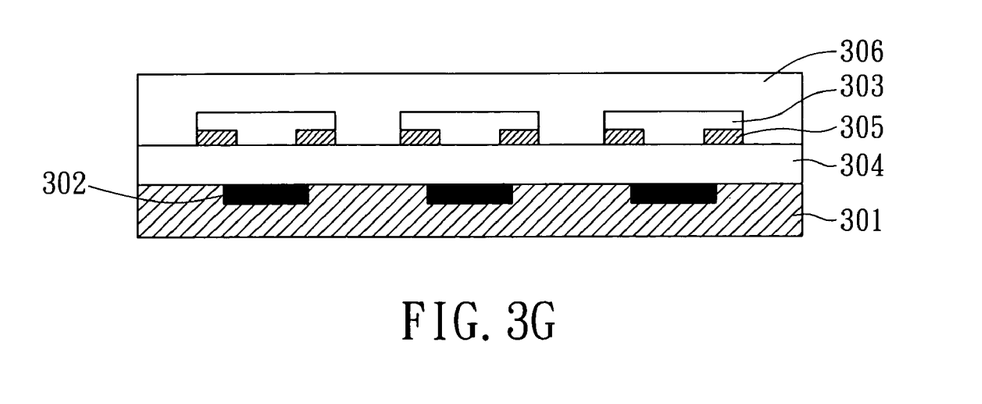

As shown in FIG. 3C, ink-jet printing (or the like) is used to fill the gate electrode regions 3010 on the plastic substrate 301 with conductive polymer materials so as to form a first electrode layer 302. The first electrode layer 302 forms the gate electrodes.

As shown in FIG. 3D to FIG. 3G, one process selected from evaporation, printing and spin-coating is performed to form an insulating layer 304, followed by the formation of a second electrode layer 305, separated from and on each of the gate electrodes 302 by the insulating layer 304 so as to form the source/drain electrodes, and a plurality of semiconductor mesas 303, each covering a pair of the source/drain electrodes 305. A passivation layer 306 is later formed. The detailed description of the OTFT is omitted since those with ordinary skills in the art can easily understand.

FOURTH EMBODIMENT

Please refer to FIG. 4A to FIG. 4G, which illustrate schematic diagrams showing steps in the method for manufacturing an organic thin-film transistor with a plastic substrate according to a fourth embodiment of the present invention. These steps are described hereinafter.

Figure 4A:
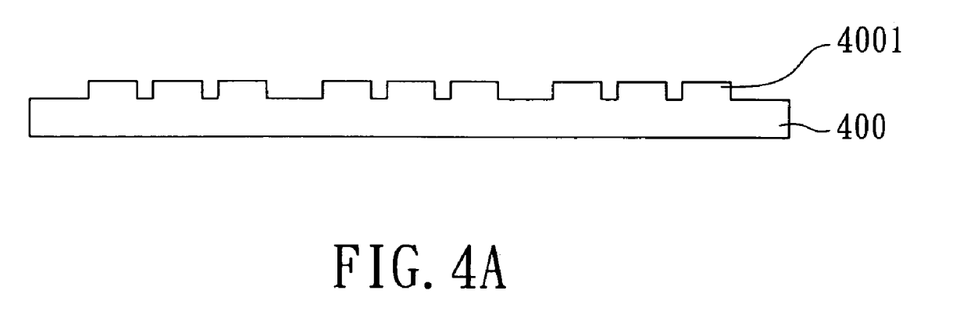
FIG. 4A to FIG. 4F are schematic diagrams showing steps in the method for manufacturing an organic thin-film transistor with a plastic substrate according to a fourth embodiment of the present invention.

As shown in FIG. 4A, a mold 400 is provided with a relief printing structure 4001, which is implemented by LIGA (Lithographie GalVanoformung Abformung), resulting in higher aspect ratio and lower surface roughness.

Figure 4B:
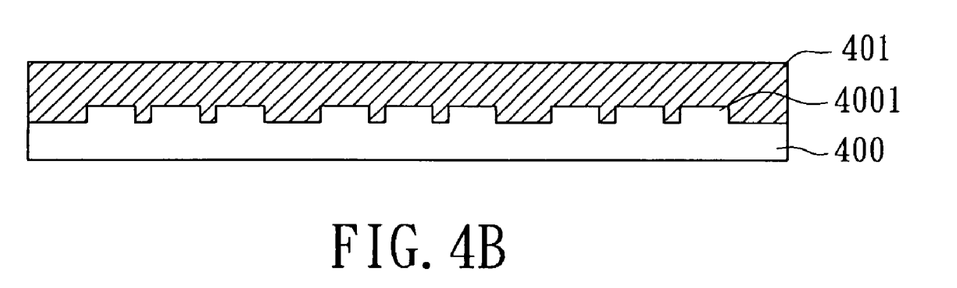

As shown in FIG. 4B, the plastic substrate 401 is imprinted using the mold 400 so as to define the gate electrode regions 4011 and the source/drain electrode regions 4012 on the plastic substrate 401. Each of the gate electrode regions 4011 is disposed between a pair of the source/drain electrode regions 4012. In the fourth embodiment, the plastic substrate 401 comprises polymer materials having —$CH_3$ or —$NH_2$ functional groups such as PMMA (poly-methylmethacrylate), mCOC (metallocenebased cyclic olefin copolymer), etc. The plastic substrate 401 is formed by imprinted without conventional photo-lithography and etching so as to reduce fabrication time and the channel length since.

Figure 4C:
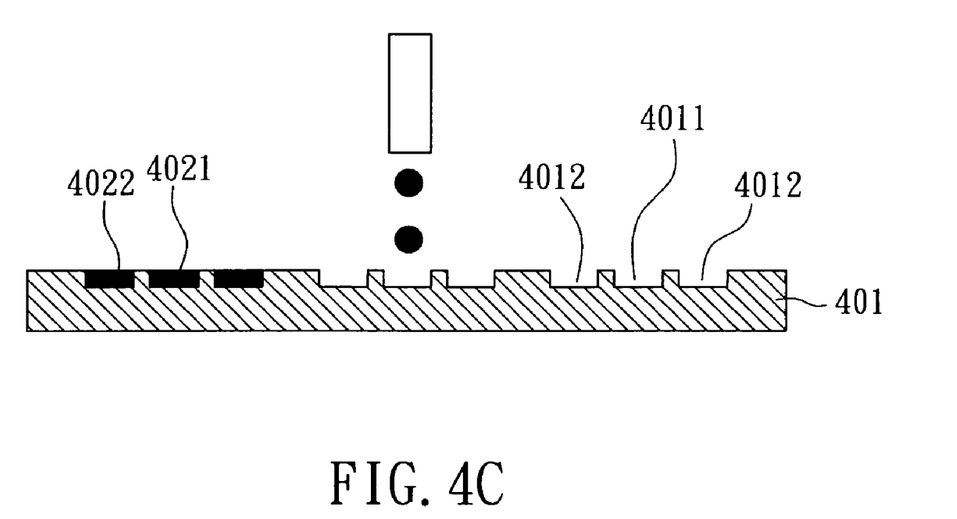

As shown in FIG. 4C, ink-jet printing (or the like) is used to fill the gate electrode regions 4011 and the source/drain electrode regions 4012 on the plastic substrate 401 with conductive polymer materials so as to form gate electrodes 4021 on the gate electrode regions 4011 and source/drain electrodes 4022 on the source/drain electrode regions 4012 on the plastic substrate 401.

Figure 4D:
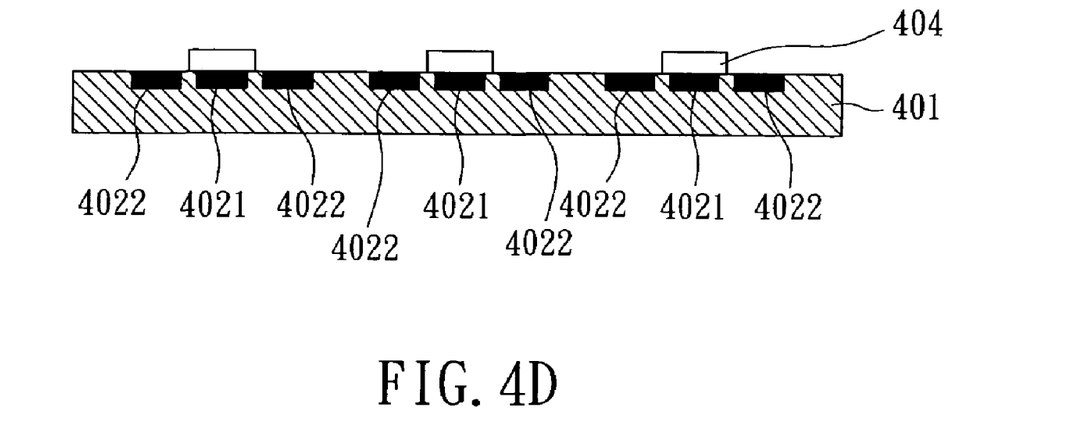
Figure 4E:
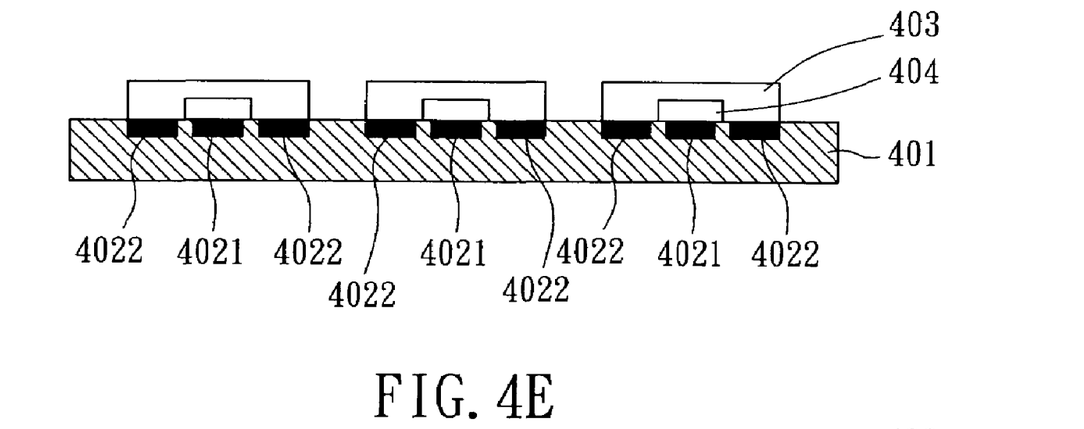
Figure 4F:
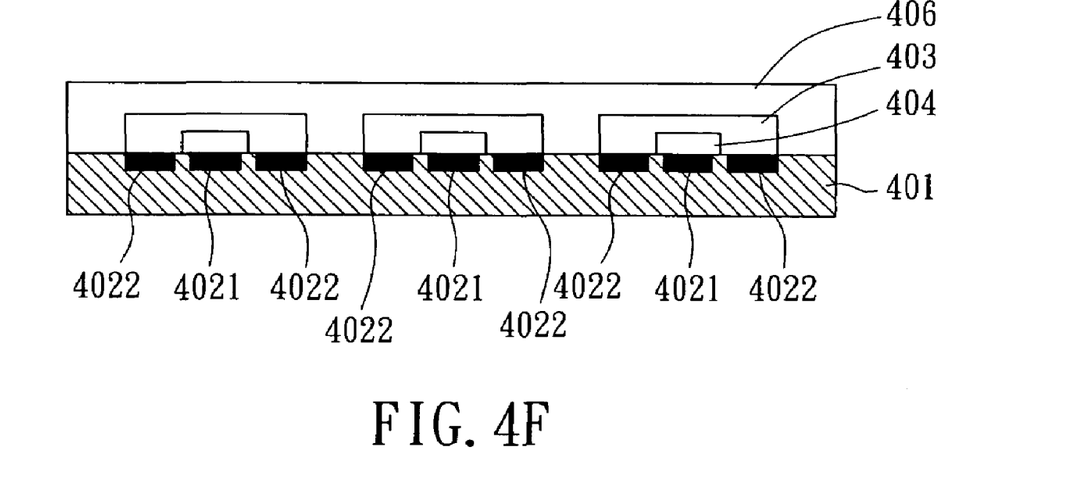

As shown in FIG. 4D to FIG. 4F, one process selected from evaporation, printing and spin-coating is performed to form a plurality of insulating mesas 404, each covering one of the gate electrode 4022, followed by the formation of a plurality of semiconductor mesas 403, each covering one of the insulating mesas 404 and a pair of the source/drain electrodes 4022. A passivation layer 406 is later formed. The detailed description of the OTFT is omitted since those with ordinary skills in the art can easily understand.

According to the above discussion, the present invention discloses a method for manufacturing an organic thin-film transistor with a plastic substrate by imprinting as to define electrode regions. Therefore, the present invention has been examined to be new, non-obvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for manufacturing an organic thin-film transistor (OTFT) with a plastic substrate, comprising steps of:
   providing a mold and a plastic substrate, said mold being provided with a relief printing structure;
   imprinting said plastic substrate by said mold so as to define source/drain electrode regions on said plastic substrate;
   forming a first electrode layer so as to form source/drain electrodes on said source/drain electrode regions on said plastic substrate;
   forming a plurality of semiconductor mesas, each of said semiconductor mesas covering a pair of said source/drain electrodes;
   forming an insulating layer;
   forming a second electrode layer, being separated from and on said semiconductor mesas by said insulating layer; and
   forming a passivation layer.

2. The method for manufacturing an organic thin-film transistor as recited in claim 1, wherein said plastic substrate comprises polymer materials having one selected from a group comprising —$CH_3$ functional groups and —$NH_2$ functional groups.

3. The method for manufacturing an organic thin-film transistor as recited in claim 1, wherein said relief printing structure is formed by LIGA (Lithographie GalVanoformung Abformung).

4. The method for manufacturing an organic thin-film transistor as recited in claim 1, wherein said first electrode layer is formed by one process selected from evaporation, printing and spin-coating.

5. The method for manufacturing an organic thin-film transistor as recited in claim 1, wherein said plurality of semiconductor mesas are formed by one process selected from evaporation, printing and spin-coating.

6. The method for manufacturing an organic thin-film transistor as recited in claim 1, wherein said insulating layer is formed by one process selected from evaporation, printing and spin-coating.

7. The method for manufacturing an organic thin-film transistor as recited in claim 1, wherein said second electrode layer is formed by one process selected from evaporation, printing and spin-coating.

8. A method for manufacturing an organic thin-film transistor (OTFT) with a plastic substrate, comprising steps of:
   providing a mold and a plastic substrate, said mold being provided with a relief printing structure;
   imprinting said plastic substrate by said mold so as to define gate electrode regions on said plastic substrate;
   forming a first electrode layer so as to form gate electrodes on said gate electrode regions on said plastic substrate;
   forming an insulating layer;
   forming a plurality of semiconductor mesas, each of said semiconductor mesas being separated from and on one of said gate electrode by said insulating layer;
   forming a second electrode layer so as to form source/drain electrodes on said plurality of semiconductor mesas; and
   forming a passivation layer.

9. The method for manufacturing an organic thin-film transistor as recited in claim 8, wherein said plastic substrate comprises polymer materials having one selected from a group comprising —CH₃ functional groups and —NH₂ functional groups.

10. The method for manufacturing an organic thin-film transistor as recited in claim 8, wherein said relief printing structure is formed by LIGA (Lithographie GalVanoformung Abformung).

11. The method for manufacturing an organic thin-film transistor as recited in claim 8, wherein said first electrode layer is formed by one process selected from evaporation, printing and spin-coating.

12. The method for manufacturing an organic thin-film transistor as recited in claim 8, wherein said plurality of semiconductor mesas are formed by one process selected from evaporation, printing and spin-coating.

13. The method for manufacturing an organic thin-film transistor as recited in claim 8, wherein said insulating layer is formed by one process selected from evaporation, printing and spin-coating.

14. The method for manufacturing an organic thin-film transistor as recited in claim 8, wherein said second electrode layer is formed by one process selected from evaporation, printing and spin-coating.

15. A method for manufacturing an organic thin-film transistor (OTFT) with a plastic substrate, comprising steps of:

providing a mold and a plastic substrate, said mold being provided with a relief printing structure;

imprinting said plastic substrate by said mold so as to define gate electrode regions on said plastic substrate;

forming a first electrode layer so as to form gate electrodes on said gate electrode regions on said plastic substrate;

forming an insulating layer;

forming a second electrode layer so as to form a pair of source/drain electrodes being separated and on each of said gate electrodes by said insulating layer;

forming a plurality of semiconductor mesas, each of said semiconductor mesas covering a pair of said source/drain electrodes; and forming a passivation layer.

16. The method for manufacturing an organic thin-film transistor as recited in claim 15, wherein said plastic substrate comprises polymer materials having one selected from a group comprising —CH₃ functional groups and —NH₂ functional groups.

17. The method for manufacturing an organic thin-film transistor as recited in claim 15, wherein said relief printing structure is formed by LIGA (Lithographie GalVanoformung Abformung).

18. The method for manufacturing an organic thin-film transistor as recited in claim 15, wherein said first electrode layer is formed by one process selected from evaporation, printing and spin-coating.

19. The method for manufacturing an organic thin-film transistor as recited in claim 15, wherein said plurality of semiconductor mesas are formed by one process selected from evaporation, printing and spin-coating.

20. The method for manufacturing an organic thin-film transistor as recited in claim 15, wherein said insulating layer is formed by one process selected from evaporation, printing and spin-coating.

21. The method for manufacturing an organic thin-film transistor as recited in claim 15, wherein said second electrode layer is formed by one process selected from evaporation, printing and spin-coating.

22. A method for manufacturing an organic thin-film transistor (OTFT) with a plastic substrate, comprising steps of:

providing a mold and a plastic substrate, said mold being provided with a relief printing structure;

imprinting said plastic substrate by said mold so as to define gate electrode regions and source/drain electrode regions on said plastic substrate, each of said gate electrode regions being disposed between a pair of said source/drain electrode regions;

forming an electrode layer so as to form gate electrodes on said gate electrode regions and source/drain electrodes on said source/drain electrode regions on said plastic substrate;

forming a plurality of insulating mesas, each of said insulating mesas covering one of said gate electrodes;

forming a plurality of semiconductor mesas, each of said semiconductor mesas covering one of said insulating mesas and a pair of said source/drain electrodes; and forming a passivation layer.

23. The method for manufacturing an organic thin-film transistor as recited in claim 15, wherein said plastic substrate comprises polymer materials having one selected from a group comprising —CH₃ functional groups and —NH₂ functional groups.

24. The method for manufacturing an organic thin-film transistor as recited in claim 15, wherein said relief printing structure is formed by LIGA (Lithographie GalVanoformung Abformung).

25. The method for manufacturing an organic thin-film transistor as recited in claim 15, wherein said electrode layer is formed by one process selected from evaporation, printing and spin-coating.

26. The method for manufacturing an organic thin-film transistor as recited in claim 15, wherein said plurality of semiconductor mesas are formed by one process selected from evaporation, printing and spin-coating.

27. The method for manufacturing an organic thin-film transistor as recited in claim 15, wherein said plurality of insulating mesas are formed by one process selected from evaporation, printing and spin-coating.

* * * * *